United States Patent
Moon et al.

(10) Patent No.: US 9,257,621 B2
(45) Date of Patent: Feb. 9, 2016

(54) EPOXY RESIN COMPOSITION AND LIGHT-EMITTING DEVICE PACKAGE COMPRISING THE SAME

(71) Applicant: LG INNOTEK CO., LTD., Seoul (KR)

(72) Inventors: Sungbae Moon, Seoul (KR); Jaehun Jeong, Seoul (KR); Mi Jin Lee, Seoul (KR); Soomin Lee, Seoul (KR); Yuwon Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/467,993

(22) Filed: Aug. 25, 2014

(65) Prior Publication Data

US 2015/0069457 A1  Mar. 12, 2015

(30) Foreign Application Priority Data

Sep. 10, 2013 (KR) .................. 10-2013-0108664
Dec. 16, 2013 (KR) .................. 10-2013-0156574

(51) Int. Cl.
| | |
|---|---|
| *H01L 33/56* | (2010.01) |
| *C08G 59/38* | (2006.01) |
| *C08G 59/42* | (2006.01) |
| *C08K 3/20* | (2006.01) |
| *C08K 3/22* | (2006.01) |

(52) U.S. Cl.
CPC ............... *H01L 33/56* (2013.01); *C08G 59/38* (2013.01); *C08G 59/4223* (2013.01); *C08K 3/20* (2013.01); *C08K 2003/2237* (2013.01)

(58) Field of Classification Search
None
See application file for complete search history.

(56) References Cited

U.S. PATENT DOCUMENTS

2013/0320393 A1* 12/2013 Moon et al. .................. 257/100

FOREIGN PATENT DOCUMENTS

JP     2012-077219     *   4/2012

OTHER PUBLICATIONS

Machine-generated translation of JP 2012-077219.*

* cited by examiner

*Primary Examiner* — Marc Zimmer
(74) *Attorney, Agent, or Firm* — Saliwanchik, Lloyd & Eisenschenk

(57) ABSTRACT

An epoxy resin composition according to an embodiment of the present invention comprises an epoxy resin, 0.05-190 parts by weight, based on 10 parts by weight of the epoxy resin, of a polyester-based curing agent, wherein the epoxy resin comprises a triazine derivative epoxy compound and a siloxane compound containing an alicyclic epoxy group and a siloxane group.

13 Claims, 3 Drawing Sheets

EPOXY RESIN COMPOSITION AND LIGHT-EMITTING DEVICE PACKAGE COMPRISING THE SAME

CROSS-REFERENCES TO RELATED APPLICATIONS

This application claims the benefit under 35 U.S.C. §119 of Korean Patent Application Nos. 10-2013-0108664, filed Sep. 10, 2013, and 10-2013-0156574, filed Dec. 16, 2013, which are hereby incorporated by reference in their entirety.

BACKGROUND

1. Technical Field

The present invention relates to an epoxy resin composition, and more particularly to an epoxy resin composition which is used in a light-emitting device package.

2. Description of the Prior Art

Light-emitting devices such as light-emitting diodes (LEDs) are used as light sources in various fields. With the development of semiconductor technology, the demand for high-power light-emitting devices has increased rapidly. To stably cope with large amounts of light and heat that are emitted from such light-emitting devices, resin compositions having excellent light resistance, heat resistance and moisture resistance are required.

As such resin compositions, epoxy resin compositions comprising triazine derivatives are used. Such epoxy resin compositions have an excellent ability to form a semi-solid, but do not satisfy the required levels of light resistance, heat resistance and moisture resistance. Particularly, such epoxy compositions are likely to yellow, and have low adhesion to silicon, and the light transmittance thereof decreases with time due to unreacted epoxy, thus adversely affecting the reliability of the light-emitting device. In particular, such epoxy compositions have low initial reflectivity, and thus the speed of light through the compositions is low.

BRIEF SUMMARY

It is an object of the present invention to provide an epoxy resin composition and a light-emitting device comprising the same.

In an embodiment of the present invention, an epoxy resin composition comprises an epoxy resin, 0.05-190 parts by weight, based on 10 parts by weight of the epoxy resin, of a polyester-based curing agent, wherein the epoxy resin comprises a triazine derivative epoxy compound and a siloxane compound containing an alicyclic epoxy group and a siloxane group.

The triazine derivative epoxy compound may comprise an isocyanurate ring, and the siloxane compound may comprise a compound of the following formula:

Epoxycycloalkyl-CH$_2$O—CO-hydroxycycloalkyl-OSiR$^1$R$^2$O—(SiR$^3$R$^4$O)$n$-SiR$^5$R$^6$O-hydroxycycloalkyl-CO—CH$_2$O-epoxycycloalkyl wherein R$^1$ to R$^6$ may be each independently selected from the group consisting of H, Cl, Br, F, a C$_1$-C$_3$ alkyl, a C$_2$-C$_3$ alkene, and a C$_2$-C$_3$ alkyne; n is a positive integer; and the cycloalkyl in the epoxycycloalkyl or the hydroxycycloalkyl is a cycloalkyl group having 5 to 20 carbon atoms.

The triazine derivative epoxy compound may comprise triglycidylisocyanurate (TGIC), and the siloxane compound may comprise a compound of the following formula:

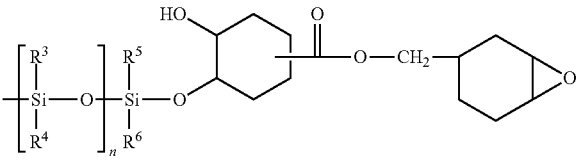

wherein R$^1$ to R$^6$ may be each independently selected from the group consisting of H, Cl, Br, F, a C$_1$-C$_3$ alkyl, a C$_2$-C$_3$ alkene, and a C$_2$-C$_3$ alkyne; and n is a positive integer.

The siloxane compound may be contained in an amount of 10-50 wt % based on the weight of the epoxy resin.

The polyester-based curing agent may comprise a compound of the following formula:

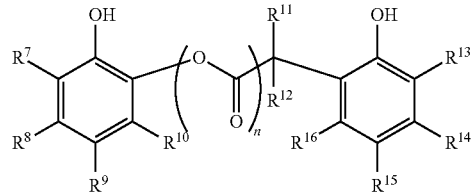

wherein R$^7$ to R$^{16}$ may be each independently selected from the group consisting of H, Cl, Br, F, a C$_1$-C$_3$ alkyl, a C$_2$-C$_3$ alkene, and a C$_2$-C$_3$ alkyne; and n is an integer ranging from 1 to 3.

The polyester-based curing agent may comprise a compound of the following formula:

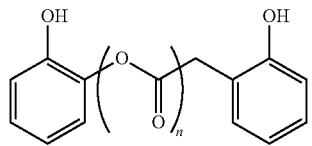

wherein n is an integer ranging from 1 to 3.

The siloxane group may be contained in an amount of 10-70 wt % based on the weight of the siloxane compound.

The siloxane group may be contained in an amount of 30-60 wt % based on the weight of the siloxane compound.

The epoxy resin composition may further comprise an inorganic filler, and the inorganic filler may comprise TiO$_2$-impregnated SiO$_2$.

The TiO$_2$-impregnated SiO$_2$ may be contained in an amount of 20-35 wt % based on the weight of the epoxy resin composition.

The TiO$_2$-impregnated SiO$_2$ may be contained in an amount of 25-35 wt % based on the weight of the epoxy resin composition.

In another embodiment of the present invention, a light-emitting device package comprises: a molded body; and a light-emitting device mounted in the molded body; the molded body comprising an epoxy resin composition comprising: an epoxy resin; 0.05-190 parts by weight, based on 10 parts by weight of the epoxy resin, of a polyester-based curing agent, wherein the epoxy resin comprises a triazine derivative epoxy compound and a siloxane compound containing an alicyclic epoxy group and a siloxane group.

DETAILED DESCRIPTION

Figure 1:
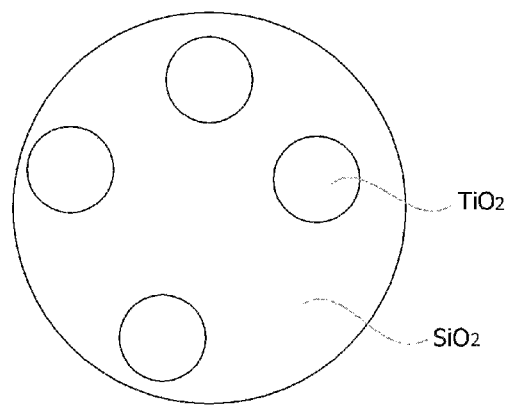
FIG. 1 shows an example of TiO2-impregnated SiO2.

Although the present invention can be modified variously and have several embodiments, exemplary embodiments are illustrated in the accompanying drawings and will be described in detail in the detailed description. However, the present invention is not limited to the specific embodiments and should be construed as including all the changes, equivalents and substitutions included in the spirit and scope of the present invention.

The terms "first", "second", etc., may be used to describe various components, but the components are not limited by the terms. The terms are used only for the purpose of distinguishing a component from other components. For example, the first component can be designated as the second component without departing from the scope of the present invention, and, similarly, the second component can also be designated as the first component. As used herein, the term "and/or" includes any and all combinations of one or more of the associated listed items.

The terms used in this specification are used only to describe a specific embodiment and are not intended to limit the scope of the present invention. Singular expressions include plural expressions unless specified otherwise in the context thereof. In this specification, the terms "comprise", "have", etc., are intended to denote the existence of mentioned characteristics, numbers, steps, operations, components, parts, or combinations thereof, but do not exclude the probability of existence or addition of one or more other characteristics, numbers, steps, operations, components, parts, or combinations thereof.

Unless otherwise defined, all terms used here, including technical or scientific terms, have the same meanings as understood by those having ordinary knowledge in the technical field to which the present invention pertains. The terms used in general and defined in dictionaries should be interpreted as having meanings identical to those specified in the context of related technology. Unless definitely defined in the present application, the terms should not be interpreted as having ideal or excessively formative meanings. It will be understood that when a layer, a film, a region or a plate is referred to as being 'on' another one, it can be directly on the other one, or one or more intervening layers, films, regions or plates may also be present. On the other hand, it will also be understood that when a layer, a film, an area or a plate is referred to as being "directly on" another one, intervening layers, films, areas, and plates may not be present.

Hereinafter, embodiments of the present invention will be described in detail with reference to the accompanying drawings. In the following description, the same elements will be denoted by the same reference numerals if possible although they are shown in different drawings. Also, the overlapping description of the same elements will be omitted herein.

In this specification, wt % can be substituted with parts by weight.

An epoxy resin composition according to an embodiment of the present invention comprises an epoxy resin and a polyester-based curing agent. An epoxy resin composition according to another embodiment of the present invention may further comprise an inorganic filler, and the inorganic filler may comprise TiO2-impregnated SiO2.

The epoxy resin composition comprises, 0.05-190 parts by weight, preferably 2.5-40 parts by weight, and more preferably 5-18 parts by weight, based on 10 parts by weight of the epoxy resin, of the polyester-based curing agent. If the content of the polyester-based curing agent is less than 0.05 parts by weight based on 10 parts by weight of the epoxy resin, the curing ability and reliability of the composition will be reduced. If the content of the polyester-based curing agent is more than 190 parts by weight based on 10 parts by weight of the epoxy resin, the light resistance, heat resistance and moisture resistance of the composition will be reduced due to unreacted curing agent.

The epoxy resin comprises a triazine derivative epoxy compound and a siloxane compound containing an alicyclic epoxy group and a siloxane group.

The weight ratio between the triazine derivative epoxy compound and the siloxane compound may be 90:10 to 50:50. In other words, the siloxane compound may be contained in an amount of 10-50 wt % based on the total weight of the epoxy resin. If the content of the siloxane compound is less than 10 wt % based on the total weight of the epoxy resin, the adhesion of the epoxy resin to a silicon filler contained in the light-emitting device will be reduced. If the content of the siloxane compound is more than 50 wt % based on the total weight of the epoxy resin, it will be difficult to semi-solidify the composition, even though the composition will have excellent heat resistance and moisture resistance.

In the present invention, the triazine derivative epoxy compound may comprise an isocyanurate ring. The epoxy compound comprising the isocyanurate ring has excellent light resistance and electrically insulating properties. The triazine derivative epoxy compound may be triglycidylisocyanurate (TGIC) such as a compound of the following formula 1:

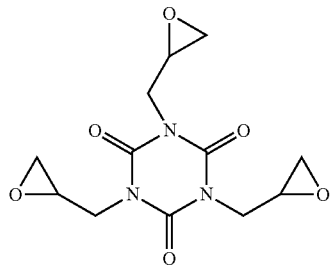

Formula 1

The siloxane compound may be represented by the following formula 2:

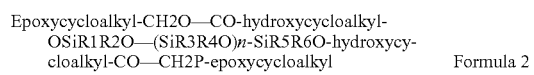

Formula 2 wherein R1 to R6 may be each independently selected from the group consisting of H, Cl, Br, F, a C1-C3 alkyl, a C2-C3 alkene, and a C2-C3 alkyne; and n is a positive integer. The four cycloalkyls in formula 2 may be each independently a cycloalkyl group having 5 to 20 carbon atoms. As used herein, the term "epoxycycloalkyl" may mean an alicyclic epoxy group.

The siloxane compound may also be represented by the following formula 3:

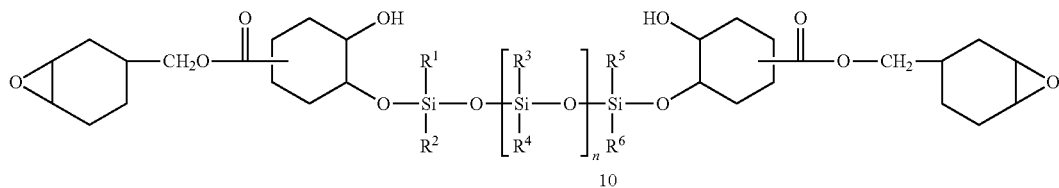

Formula 3 wherein R1 to R6 may be each independently selected from the group consisting of H, Cl, Br, F, a C1-C3 alkyl, a C2-C3 alkene, and a C2-C3 alkyne. n in formula 3 may be determined such that the following formula 4 constitutes 10-70 wt %, preferably 30-60 wt %, more preferably 35-55 wt %, and even more preferably 40-50 wt % of the weight of the compound of formula 3. In the present invention, the following formula 4 may be referred to as a siloxane group:

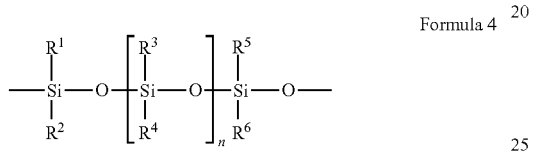

Formula 4

If the content of formula 4 is less than 10 wt % of the weight of the compound of formula 3, the adhesion of the silicon filler in the light-emitting device will be reduced. If the content of formula 4 is more than 70 wt % of the weight of the compound of formula 3, it will be difficult to semi-solidity the composition. When R1 to R6 are each a methyl group, n may be a positive integer ranging from 1 to 16, preferably from 2 to 8, more preferably from 2 to 6, and even more preferably from 3 to 5. When each of R1 to R6 is not a methyl group, n can be determined such that the siloxane group of formula 4 is contained in an amount of 10-70 wt % based on 100 wt % of the siloxane compound of formula 3.

The epoxy resin composition according to the embodiment of the present invention may further comprise other epoxy compounds. For example, the epoxy resin composition may comprise at least one epoxy resin obtained by hydrogenating the aromatic ring of bisphenol A-type epoxy resin, bisphenol F-type epoxy resin, bisphenol-type epoxy resin such as 3,3', 5,5'-tetramethyl-4,4'-biphenol-type epoxy resin or 4,4'-biphenol-type epoxy resin, phenol novolac-type epoxy resin, cresol novolac-type epoxy resin, bisphenol A novolac-type epoxy resin, naphthalenediol-type epoxy resin, triphenylolmethane-type epoxy resin, or tetraphenylolethane-type epoxy resin.

Meanwhile, the polyester-based curing agent contained in the epoxy resin composition according to the embodiment of the present invention may comprise a compound of the following formula 5:

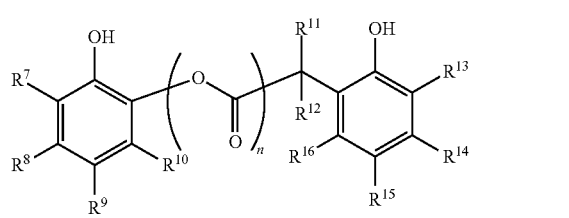

Formula 5 wherein R7 to R16 may be each independently selected from the group consisting of H, Cl, Br, F, a C1-C3 alkyl, a C2-C3 alkene, and a C2-C3 alkyne; and n is an integer ranging from 1 to 3.

The polyester-based curing agent may also be represented by the following formula 6:

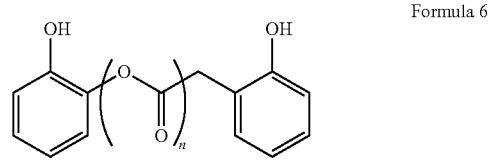

Formula 6 wherein n is an integer ranging from 1 to 3.

This polyester-based curing agent has high heat resistance.

In addition, the epoxy resin composition according to the embodiment of the present invention may further comprise one curing agent selected from among diisocyanate, β-hydroxyl alkylamide, triglycidyl isocyanate (TGIC), uretdione, and mixtures thereof.

Also, the epoxy resin composition according to the embodiment of the present invention may further comprise an acid anhydride-based curing agent. The acid anhydride-based curing agent may be one selected from among, for example, dodecenyl succinic anhydride, polyadipic anhydride, polyazelaic anhydride, polysebacic anhydride, poly(ethyloctadecanedioic) anhydride, poly(phenylhexadecanedioic) anhydride, methyltetrahydrophthalic anhydride, methylhexahydrophthalic anhydride, hexahydrophthalic anhydride, methylhyamic anhydride, tetrahydrophthalic anhydride, trialkyltetrahydrophthalic anhydride, methylcyclohexenedicarboxylic anhydride, methylcyclohexenetetracarbonxylic anhydride, phthalic anhydride, trimellitic anhydride, pyromellitic anhydride, benzophenonetetracarboxylic anhydride, ethylene glycol bis-trimellitate, hetic anhydride, nadic anhydride, methylnadic anhydride, 5-(2,5-dioxotetrahydro-3-furanyl)-3-methyl-3-cyclohexane-1,2-dicarboxylic anhydride, 3,4-dicarboxy-1,2,3,4-tetrahydro-1-naphthalene succinic dianhydride, 1-methyl-dicarboxy-1,2,3,4-tetrahydro-1-naphthalenesuccinic dianhydride, and mixtures thereof.

The epoxy resin composition may further comprise a curing accelerator. The curing accelerator may be one selected from among, for example, tertiary amines, imidazoles, organic carboxylic acid salts thereof, organic carboxylic acid metal salts, metal-organic chelate compounds, aromatic sulfonium salts, organic phosphine compounds, salts thereof, phosphorus based curing catalysts (for example, 2-ethyl-4-methylimidazole, methyl-tributylphosphonium-dimethyl phosphate, and quaternary phosphonium bromide), and mixtures thereof.

The epoxy resin composition may further comprise additives. Examples of the additives include a dispersing agent, a labeling agent, an antioxidant, etc. The antioxidant may be at least one of, for example, phenol-based antioxidants, phosphorus-based antioxidants, and sulfur-based antioxidants.

Examples of the phenol-based antioxidant that may be used in the present invention include 2,6-di-t-butyl-p-cresol, butylated hydroxyanisole, 2,6-di-t-butyl-p-ethylphenol, stearyl-β-(3,5-di-t-butyl-4-hydroxyphenyl)propionate, 2,2'-methylenebis(4-methyl-6-t-butylphenol), 4,4'-butylidenebis(3-methyl-6-t-butylphenol), 3,9-bis[1,1-dimethyl-2-{β-(3-t-butyl-4-hydroxy-5-methylphenyl)propionyoxy}ethyl]2,4,8,10-tetraoxypyro[5.5]undecane, 1,1,3-tris(2-methyl-4-hydroxy-5-t-butylphenyl)butane, 1,3,5-trimethyl-2,4,6-tris(3,5-di-t-butyl-4-hydroxybenzyl)benzene, etc.

Examples of the phosphorus-based antioxidant that may be used in the present invention include triphenyl phosphite, diphenyl phosphite, diphenylalkyl phosphite, phenyldialkyl phosphite, tri(nonylphenyl) phosphite, trilauryl phosphite, trioctadecyl phosphite, distearyl pentaerythritol diphosphite, tris(2,4-di-tert-butylphenyl)phosphite, diisodecyl pentaerythritol diphosphite, di(2,4-di-tert-butylphenyl)pentaerythritol diphosphite, tristearylsorbitol triphosphite, tetrakis(2,4-di-tert-butylphenyl)-4,4'-biphenyl diphosphite, etc.

Examples of the sulfur-based antioxidant that may be used in the present invention include dilauryl-3,3'-thiopropionate, dimyristyl-3,3'-thiopropionate, distearyl-3,3'-thiodipropionate, etc.

The epoxy resin composition may further comprise a releasing agent. The releasing agent can promote the release of the epoxy resin composition after molding. The releasing agent may be one selected from among, for example, carnauba wax, montanic acid, stearic acid, higher fatty acids, higher fatty acid metal salts, ester-based wax such as montanic acid ester, polyethylene-based wax, polyolefinic wax, and mixtures thereof.

The epoxy resin composition according to the embodiment of the present invention may further comprise an inorganic filler. The inorganic filler may be contained in an amount of 15-90 parts by weight based on the 10 parts by weight of sum of the epoxy resin and the polyester-based curing agent. If the content of the inorganic filler is less than 15 parts by weight based on the 10 part by weight of the sum of the epoxy resin and the polyester-based curing agent, the high thermal conductivity, low thermal expansion coefficient and high heat resistance of the composition will not be guaranteed, and the strength of the composition will be reduced. The thermal conductivity, thermal expansion coefficient and high heat resistance of the composition are improved as the content of the inorganic filler is increased. These properties are not improved in proportion to the content of the inorganic filler, but are improved rapid from a specific content of the inorganic filler. However, if the content of the inorganic filler is more than 90 parts by weight based on the 10 part by weight of the sum of the epoxy resin and the polyester-based curing agent, the ratio of the epoxy resin functioning as a binder between the inorganic filler particles will be reduced, and thus the flowability and moldability of the composition will be reduced.

The inorganic filler that is contained in the epoxy resin composition according to the embodiment of the present invention may be one selected from among SiO2, TiO2, TiO2-impregnated SiO2, and mixtures thereof.

Herein, SiO2 is in the form of spherical particles having a size of 1-100 μm, and TiO2 is in the form of spherical particles having a size of 100-500 nm. When SiO2 is used as the inorganic filler, it can increase the mechanical strength of the resin composition, and when TiO2 is used as the inorganic filler, it can increase the reflectivity of the resin composition. However, TiO2 particles tend to agglomerate with each other. Thus, if TiO2 is added to the composition so that a desired level of reflectivity can be obtained, there will be a problem in that the mechanical strength of the resin composition will be reduced due to the agglomeration of the TiO2 particles.

For this reason, in an embodiment of the present invention, the epoxy resin composition further comprises TiO2-impregnated SiO2 as the inorganic filler. FIG. 1 shows an example of TiO2-impregnated SiO2. When TiO2-impreganted SiO2 is used as the inorganic filler, the agglomeration of TiO2 particles can be prevented, and thus the reflectivity and mechanical strength of the resin composition can all be satisfied. In TiO2-impregnated SiO2, TiO2 may be contained in an amount of 2-3 parts by weight based on 10 parts by weight of SiO2. If the content of TiO2 is less than 2 parts by weight based on 10 parts by weight of SiO2, a desired level of reflectivity cannot be obtained. If the content of TiO2 is more than 3 parts by weight based on 10 parts by weight of SiO2, a desired level of mechanical strength cannot be obtained.

According to an embodiment of the present invention, TiO2-impregnated SiO2 may be contained in an amount of 20-35 wt %, and preferably 25-35 wt %, based on the total weight of the epoxy resin composition. If the content of TiO2-impregnated SiO2 is less than 20 wt % or more than 35 wt % based on the total weight of the epoxy resin composition, the initial reflectivity of the epoxy resin composition can be reduced, and the strength of a device comprising the composition can be reduced.

The inorganic filler may further comprise one selected from among alumina, boron nitride, magnesium oxide, aluminum nitride, carbon nanotubes, graphite, carbon fiber, and mixtures thereof.

The epoxy resin composition according to the embodiment of the present invention may be applied to a light-emitting device. For example, the epoxy resin composition according to the embodiment of the present invention may be used to mold or encapsulate a light-emitting device.

Figure 2:
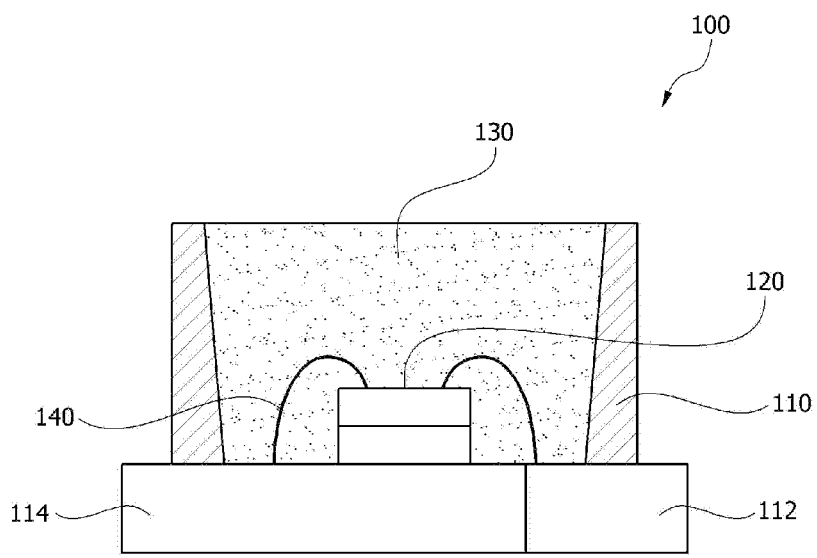
FIG. 2 shows an example of a light-emitting device.

FIG. 2 shows an example of a light-emitting device package.

Referring to FIG. 2, a light-emitting device package 100 comprises a molded body 110, a light-emitting device 120 mounted in the molded body 110, and a molding member 130 surrounding the light-emitting device 120. The molded body 110 may be composed of a cured material comprising an epoxy resin composition according to an embodiment of the present invention. The molded body 110 comprises an inclined surface surrounding the light-emitting device 120 and functions to protect the light-emitting device 120 and reflect light emitted from the light-emitting device 120.

The light-emitting device 120 has a pair of electrodes, a positive electrode and a negative electrode, which are connected to leads 112 and 114, respectively, by wires 140. The molding member 130 surrounds and protects the light-emitting device 120. The molding member 130 may comprise at least one of a triazine derivative epoxy compound and a siloxane compound. The molding member 130 may comprise, for example, an epoxy resin composition according to an embodiment of the present invention. The molding member 130 may further comprise a phosphor to change the wavelength of light emitted from the light-emitting device 120.

The light-emitting device package according to the embodiment of the present invention may be used in various applications, including illuminating devices, backlight units (BLUs) for display devices, UHD (Ultra High Definition) TVs, laptop computers, tablet PCs, cameras, and portable terminals.

Figure 3:
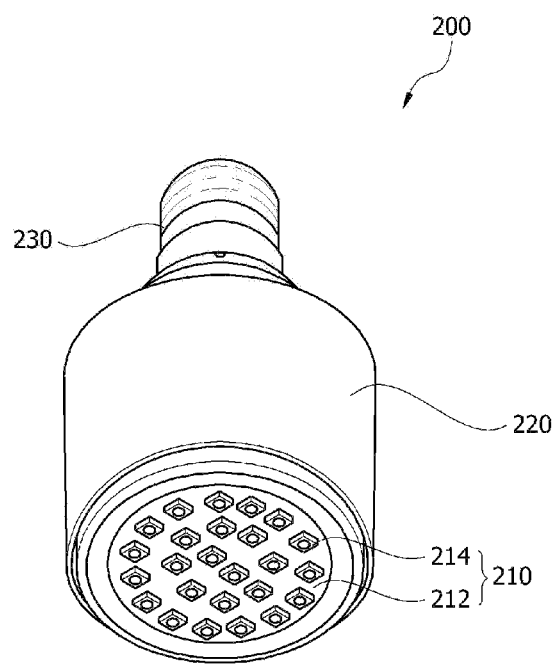
FIG. 3 shows an illuminating device comprising a light-emitting device according to an embodiment of the present invention.

FIG. 3 shows an illuminating device comprising a light-emitting device package according to an embodiment of the present invention.

Referring to FIG. 3, an illuminating device 200 comprises a light-emitting module 210, a case 220 and a connection terminal 230.

The light-emitting module 210 is received in the case 220. The connection terminal 230 is connected to the case 220 and functions to supply power from an external power source (not shown) to the light-emitting module 210. FIG. 3 illustrates that the connection terminal 230 is connected to the external power source in a socket manner, but is not limited thereto.

The light-emitting module 210 comprises a substrate 212 and at least one light-emitting device package 214 mounted on the substrate 212. The light-emitting device package 214 may comprise a light-emitting device and a molded body comprising an epoxy resin composition according to an embodiment of the present invention.

Figure 4:
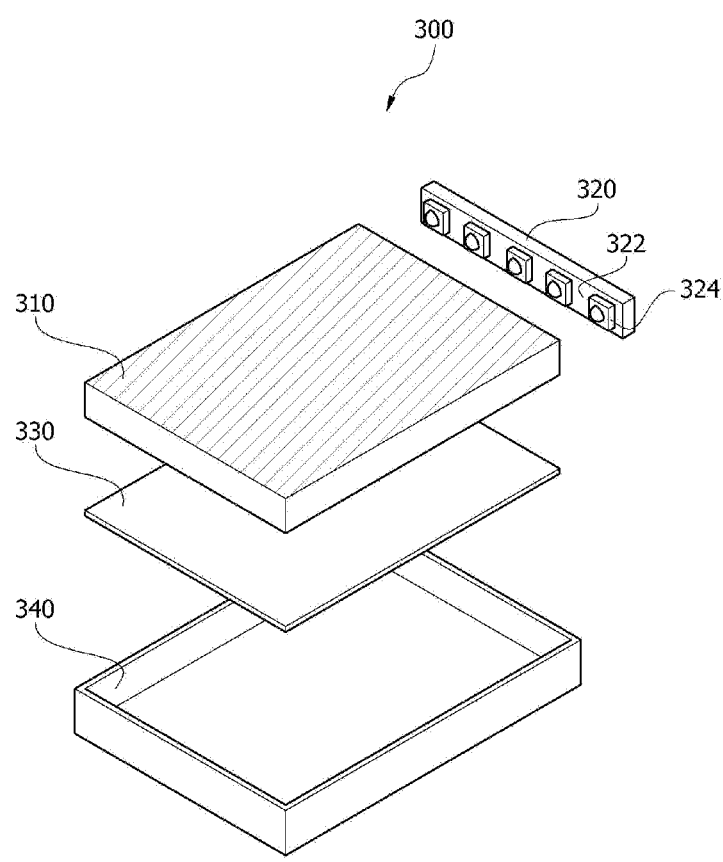
FIG. 4 shows a backlight unit comprising a light-emitting device according to an embodiment of the present invention.

FIG. 4 shows a backlight unit comprising a light-emitting device package according to an embodiment of the present invention.

Referring to FIG. 4, a backlight unit 300 comprises a light guide plate 310, a light-emitting module 320, a reflection member 330 and a bottom cover 340. The light guide plate 310 functions to diffuse light to form surface light. The light-emitting module 320 is a light source for a display device including the backlight unit and functions to provide light to the light guide plate 310. The light-emitting module 320 comprises a substrate 322 and at least one light-emitting device package 324, and the light-emitting device package 324 may be mounted on the substrate 322. The light-emitting device package 324 may comprise a light-emitting device and a molded body comprising an epoxy resin composition according to an embodiment of the present invention.

The reflection member 330 is provided under the light guide plate 310 and can function to reflect light incident on the lower surface of the light guide plate 310 to direct the light upward, thereby increasing the brightness of the backlight unit.

The bottom cover 340 functions to receive the light guide plate 310, the light-emitting module 320 and the reflection member 330. For this purpose, the bottom cover 340 may be a box shape open at the upper portion thereof, but is not limited thereto.

Hereinafter, the present invention will be described in further detail with reference to examples and comparative examples.

EXAMPLE 1

30 wt % of the epoxy compound of formula 1, 20 wt % of the epoxy compound of formula 3 (wherein R1 to R6 are each a methyl group, and n is 1) and 50 wt % of the curing agent of formula 6 were mixed with each other, and the mixture was heat-treated, thereby obtaining a composition of Example 1.

EXAMPLE 2

30 wt % of the epoxy compound of formula 1, 20 wt % of the epoxy compound of formula 3 (wherein R1 to R6 are each a methyl group, and n is 2) and 50 wt % of the curing agent of formula 6 were mixed with each other, and the mixture was heat-treated, thereby obtaining a composition of Example 2.

EXAMPLE 3

30 wt % of the epoxy compound of formula 1, 20 wt % of the epoxy compound of formula 3 (wherein R1 to R6 are each a methyl group, and n is 5) and 50 wt % of the curing agent of formula 6 were mixed with each other, and the mixture was heat-treated, thereby obtaining a composition of Example 3.

EXAMPLE 4

30 wt % of the epoxy compound of formula 1, 20 wt % of the epoxy compound of formula 3 (wherein R1 to R6 are each a methyl group, and n is 14) and 50 wt % of the curing agent of formula 6 were mixed with each other, and the mixture was heat-treated, thereby obtaining a composition of Example 4.

COMPARATIVE EXAMPLE 1

30 wt % of the epoxy compound of formula 1, 20 wt % of the epoxy compound of formula 3 (wherein R1 to R6 are each a methyl group, and n is 1) and 50 wt % of the acid anhydride-based curing agent MH-700G (methylhexahydrophthalic anhydride) were mixed with each other, and the mixture was heat-treated, thereby obtaining a composition of Comparative Example 1.

COMPARATIVE EXAMPLE 2

30 wt % of the epoxy compound of formula 1, 20 wt % of the epoxy compound of formula 3 (wherein R1 to R6 are each a methyl group, and n is 2) and 50 wt % of the acid anhydride-based curing agent MH-700G (methylhexahydrophthalic anhydride) were mixed with each other, and the mixture was heat-treated, thereby obtaining a composition of Comparative Example 2.

COMPARATIVE EXAMPLE 3

30 wt % of the epoxy compound of formula 1, 20 wt % of the epoxy compound of formula 3 (wherein R1 to R6 are each a methyl group, and n is 5) and 50 wt % of the acid anhydride-based curing agent MH-700G were mixed with each other, and the mixture was heat-treated, thereby obtaining a composition of Comparative Example 3.

COMPARATIVE EXAMPLE 4

30 wt % of the epoxy compound of formula 1, 20 wt % of the epoxy compound of formula 3 (wherein R1 to R6 are each a methyl group, and n is 14) and 50 wt % of the acid anhydride-based curing agent MH-700G were mixed with each other, and the mixture was heat-treated, thereby obtaining a composition of Comparative Example 3.

Each of the compositions of Examples 1 to 4 and Comparative Examples 1 to 4 was irradiated with light having a wavelength of 450 nm while the initial light transmittance thereof was measured. Also, each of the compositions of Examples 1 to 4 and Comparative Examples 1 to 4 was irradiated with light having a wavelength of 450 nm at 175° C. for 24 hours, and then the light transmittance thereof was measured. The results of the measurement are shown in Table 1 below.

TABLE 1

| No. | Initial light transmittance | Light transmittance after irradiation |
|---|---|---|
| Example 1 | 92% | 92% |
| Example 2 | 94% | 93% |
| Example 3 | 96% | 96% |
| Example 4 | 93% | 92% |

TABLE 1-continued

| No. | Initial light transmittance | Light transmittance after irradiation |
| --- | --- | --- |
| Comparative Example 1 | 91% | 90% |
| Comparative Example 2 | 90% | 90% |
| Comparative Example 3 | 92% | 91% |
| Comparative Example 4 | 91% | 89% |

As can be seen in Table 1 above, the compositions of Examples 1 to 4, which contain the polyester-based curing agent, showed an initial light transmittance of 92-96% and a light transmittance after irradiation of 92-96%, but the compositions of Comparative Examples 1 to 4, which contain the acid anhydride-based curing agent, showed an initial light transmittance of 90-92% and a light transmittance after irradiation of 89-91%.

Particularly, in the compositions of Example 1 and Comparative Example 1, the ratio of the siloxane group in the siloxane compound was the same (about 10 wt %) between the compositions, but different curing agents were used. The composition of Example 1, which comprises the polyester-based curing agent, showed a light transmittance after irradiation of 92%, which is higher than that (90%) of the composition of Comparative Example 1, which contains the acid anhydride-based curing agent.

In the compositions of Example 2 and Comparative Example 2, the ratio of the siloxane group in the siloxane compound was the same (about 30 wt %) between the compositions, but different curing agents were used. The composition of Example 2, which comprises the polyester-based curing agent, showed a light transmittance after irradiation of 93%, which is higher than that (90%) of the composition of Comparative Example 2, which contains the acid anhydride-based curing agent.

In the compositions of Example 3 and Comparative Example 3, the ratio of the siloxane group in the siloxane compound was the same (about 50 wt %) between the compositions, but different curing agents were used. The composition of Example 3, which comprises the polyester-based curing agent, showed a light transmittance after irradiation of 96%, which is higher than that (91%) of the composition of Comparative Example 3, which contains the acid anhydride-based curing agent.

In the compositions of Example 4 and Comparative Example 4, the ratio of the siloxane group in the siloxane compound was the same (about 70 wt %) between the compositions, but different curing agents were used. The composition of Example 4, which comprises the polyester-based curing agent, showed a light transmittance after irradiation of 92%, which is higher than that (89%) of the composition of Comparative Example 4, which contains the acid anhydride-based curing agent.

Meanwhile, when an epoxy resin composition according to an embodiment of the present invention further comprises $TiO_2$-impregnated $SiO_2$ as an inorganic filler, the initial reflectivity thereof can be increased. Hereinafter, this epoxy resin composition will be described in further detail with reference to Examples and Comparative Examples.

EXAMPLE 5

20 wt % of a combination of the epoxy compound of formula 1, the epoxy compound of formula 3 (wherein R1 to R6 are each a methyl group, and n is 2) and the curing agent of formula 6 (the weight ratio between the epoxy compound of formula 1, the epoxy compound of formula 3 and the curing agent of formula 6=3:2:5) was mixed with 80 wt % of an inorganic filler (which was composed of $SiO_2$, $TiO_2$ and $TiO_2$-impregnated $SiO_2$ at a weight ratio of 38:22:20; the weight ratio between $TiO_2$ and $SiO_2$ in $TiO_2$-impregnated $SiO_2$ was 2:8), and the mixture was heat-treated, thereby obtaining a composition of Example 5.

EXAMPLE 6

20 wt % of a combination of the epoxy compound of formula 1, the epoxy compound of formula 3 (wherein R1 to R6 are each a methyl group, and n is 2) and the curing agent of formula 6 (the weight ratio between the epoxy compound of formula 1, the epoxy compound of formula 3 and the curing agent of formula 6=3:2:5) was mixed with 80 wt % of an inorganic filler (which was composed of $SiO_2$, $TiO_2$ and $TiO_2$-impregnated $SiO_2$ at a weight ratio of 34:21:25; the weight ratio between $TiO_2$ and $SiO_2$ in $TiO_2$-impregnated $SiO_2$ was 2:8), and the mixture was heat-treated, thereby obtaining a composition of Example 6.

EXAMPLE 7

20 wt % of a combination of the epoxy compound of formula 1, the epoxy compound of formula 3 (wherein R1 to R6 are each a methyl group, and n is 2) and the curing agent of formula 6 (the weight ratio between the epoxy compound of formula 1, the epoxy compound of formula 3 and the curing agent of formula 6=3:2:5) was mixed with 80 wt % of an inorganic filler (which was composed of $SiO_2$, $TiO_2$ and $TiO_2$-impregnated $SiO_2$ at a weight ratio of 30:20:30; the weight ratio between $TiO_2$ and $SiO_2$ in $TiO_2$-impregnated $SiO_2$ was 2:8), and the mixture was heat-treated, thereby obtaining a composition of Example 7.

EXAMPLE 8

20 wt % of a combination of the epoxy compound of formula 1, the epoxy compound of formula 3 (wherein R1 to R6 are each a methyl group, and n is 2) and the curing agent of formula 6 (the weight ratio between the epoxy compound of formula 1, the epoxy compound of formula 3 and the curing agent of formula 6=3:2:5) was mixed with 80 wt % of an inorganic filler (which was composed of $SiO_2$, $TiO_2$ and $TiO_2$-impregnated $SiO_2$ at a weight ratio of 26:19:35; the weight ratio between $TiO_2$ and $SiO_2$ in $TiO_2$-impregnated $SiO_2$ was 2:8), and the mixture was heat-treated, thereby obtaining a composition of Example 8.

COMPARATIVE EXAMPLE 5

20 wt % of a combination of the epoxy compound of formula 1, the epoxy compound of formula 3 (wherein R1 to R6 are each a methyl group, and n is 2) and the curing agent of formula 6 (the weight ratio between the epoxy compound of formula 1, the epoxy compound of formula 3 and the curing agent of formula 6=3:2:5) was mixed with 80 wt % of an inorganic filler (which was composed of $SiO_2$, $TiO_2$ and $TiO_2$-impregnated $SiO_2$ at a weight ratio of 54:26:0), and the mixture was heat-treated, thereby obtaining a composition of Comparative Example 5.

COMPARATIVE EXAMPLE 6

20 wt % of a combination of the epoxy compound of formula 1, the epoxy compound of formula 3 (wherein R1 to $R^6$ are each a methyl group, and n is 2) and the curing agent of formula 6 (the weight ratio between the epoxy compound of formula 1, the epoxy compound of formula 3 and the curing agent of formula 6=3:2:5) was mixed with 80 wt % of an inorganic filler (which was composed of $SiO_2$, $TiO_2$ and $TiO_2$-impregnated $SiO_2$ at a weight ratio of 46:24:10; the weight ratio between $TiO_2$ and $SiO_2$ in $TiO_2$-impregnated $SiO_2$ was 2:8), and the mixture was heat-treated, thereby obtaining a composition of Comparative Example 6.

COMPARATIVE EXAMPLE 7

20 wt % of a combination of the epoxy compound of formula 1, the epoxy compound of formula 3 (wherein $R^1$ to $R^6$ are each a methyl group, and n is 2) and the curing agent of formula 6 (the weight ratio between the epoxy compound of formula 1, the epoxy compound of formula 3 and the curing agent of formula 6=3:2:5) was mixed with 80 wt % of an inorganic filler (which was composed of $SiO_2$, $TiO_2$ and $TiO_2$-impregnated $SiO_2$ at a weight ratio of 22:18:40; the weight ratio between $TiO_2$ and $SiO_2$ in $TiO_2$-impregnated $SiO_2$ was 2:8), and the mixture was heat-treated, thereby obtaining a composition of Comparative Example 7.

Each of the compositions of Examples 5 to 8 and Comparative Examples 5 to 7 was irradiated with light having a wavelength of 450 nm while the initial reflectivity thereof was measured. The results of the measurement are shown in Table 2 below.

TABLE 2

|  | Initial reflectivity |
| --- | --- |
| Example 5 | 94% |
| Example 6 | 95% |
| Example 7 | 96% |
| Example 8 | 95% |
| Comparative Example 5 | 92% |
| Comparative Example 6 | 93% |
| Comparative Example 7 | 93% |

In the compositions of Examples 5 to 8 and Comparative Examples 5 to 7, the contents of the epoxy resin, the curing agent and the inorganic filler are the same between the compositions, and the content ratio of $SiO_2$ and $TiO_2$ in the inorganic filler was also the same (54:26). However, the compositions of Examples 5 to 8, which contain $TiO_2$-impregnated $SiO_2$ as the inorganic filler, showed an initial reflectivity of 94% or higher, but the composition of Comparative Example 5, which contains only $TiO_2$ and $SiO_2$ as the inorganic filler, showed an initial reflectivity of 92%. Further, it can be seen that the initial reflectivity of the epoxy resin compositions of Examples 5 to 8, which contain $TiO_2$-impregnated $SiO_2$ in an amount of 20-35 wt % based on the total weight of the composition, was higher than that of the compositions of Comparative Examples 6 and 7, which contain $TiO_2$-impregnated $SiO_2$ in an amount of 10 wt % or 40 wt % based on the total weight of the composition. Particularly, it can be seen that the epoxy resin compositions of Examples 5 to 8, which contain $TiO_2$-impregnated $SiO_2$ in an amount of 20-35 wt % based on the total weight of the composition, have an initial reflectivity of 95% or higher.

As described above, embodiments of the present invention provide an epoxy resin composition, which has excellent light resistance, heat resistance and moisture resistance and high initial reflectivity and can be semi-solidified. This epoxy resin composition can be prevented from yellowing and can maintain its heat resistance and light resistance, even when it is exposed to high temperature and light for a long period of time. Accordingly, the epoxy resin composition makes it possible to obtain a highly efficient light-emitting device.

Although the preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An epoxy resin composition comprising: an epoxy resin; and 0.05-190 parts by weight, based on 10 parts by weight of the epoxy resin, of a curing agent, wherein the epoxy resin comprises a triglycidylisocyanurate (TGIC) and a siloxane compound containing an alicyclic epoxy group and a siloxane group, wherein the curing agent comprises a compound of the following formula:

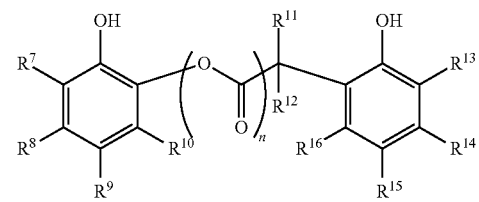

wherein R7 to R16 is each independently selected from H, Cl, Br, F, C1-C3 alkyl, C2-C3 alkene, and C2-C3 alkyne; and n is an integer ranging from 1 to 3.

2. The epoxy resin composition of claim 1, wherein the siloxane compound comprises a compound represented by the following formula:

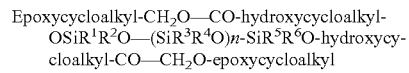

Epoxycycloalkyl-$CH_2O$—CO-hydroxycycloalkyl-$OSiR^1R^2O$—$(SiR^3R^4O)n$-$SiR^5R^6O$-hydroxycycloalkyl-CO—$CH_2O$-epoxycycloalkyl wherein $R^1$ to $R^6$ is each independently selected from H, Cl, Br, F, $C_1$-$C_3$ alkyl, $C_2$-$C_3$ alkene, and $C_2$-$C_3$ alkyne; n is a positive integer; and the cycloalkyl in the epoxycycloalkyl or the hydroxycycloalkyl is a cycloalkyl group having 5 to 20 carbon atoms.

3. The epoxy resin composition of claim 2, wherein the siloxane compound comprises a compound of the following formula:

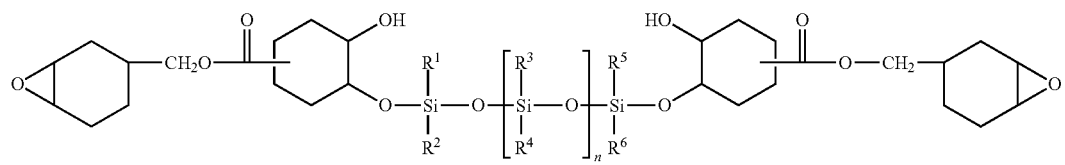

wherein $R^1$ to $R^6$ may be each independently selected from H, Cl, Br, F, $C_1$-$C_3$ alkyl, $C_2$-$C_3$ alkene, and $C_2$-$C_3$ alkyne; and n is a positive integer.

4. The epoxy resin composition of claim 1, wherein the siloxane compound is contained in an amount of 10-50 wt % based on the weight of the epoxy resin.

5. The epoxy resin composition of claim 1, wherein the curing agent comprises a compound of the following formula:

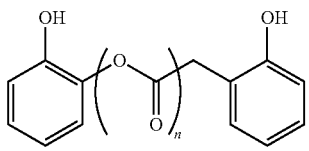

wherein n is an integer ranging from 1 to 3.

6. The epoxy resin composition of claim 1, wherein the siloxane group is contained in an amount of 10-70 wt % based on the weight of the siloxane compound.

7. The epoxy resin composition of claim 6, wherein the siloxane group is contained in an amount of 30-60 wt % based on the weight of the siloxane compound.

8. The epoxy resin composition of claim 1, wherein the epoxy resin composition further comprises an inorganic filler, and the inorganic filler comprises $TiO_2$-impregnated $SiO_2$.

9. The epoxy resin composition of claim 8, wherein the $TiO_2$-impregnated $SiO_2$ is contained in an amount of 20-35 wt % based on the weight of the epoxy resin composition.

10. The epoxy resin composition of claim 9, wherein the $TiO_2$-impregnated $SiO_2$ is contained in an amount of 25-35 wt % based on the weight of the epoxy resin composition.

11. A light-emitting device package comprising: a molded body; and a light-emitting device mounted in the molded body; the molded body comprising an epoxy resin composition comprising: an epoxy resin; 0.05-190 parts by weight, based on 10 parts by weight of the epoxy resin, of a curing agent, wherein the epoxy resin comprises a triglycidylisocyanurate (TGIC) and a siloxane compound containing an alicyclic epoxy group and a siloxane group, wherein the curing agent comprises a compound of the following formula:

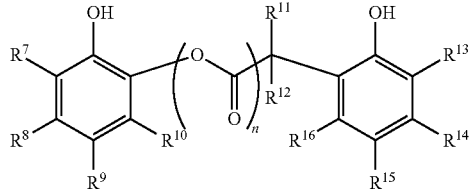

wherein R7 to R16 is each independently selected from H, Cl, Br, F, C1-C3 alkyl, C2-C3 alkene, and C2-C3 alkyne; and n is an integer ranging from 1 to 3.

12. The light-emitting device package of claim 11, further comprising a molding member surrounding the light-emitting device, wherein the molding member comprises an epoxy resin composition comprising: an epoxy resin; 0.05-190 parts by weight, based on 10 parts by weight of the epoxy resin, of the curing agent, wherein the epoxy resin comprises a triglycidylisocyanurate (TGIC) and a siloxane compound containing an alicyclic epoxy group and a siloxane group.

13. The light-emitting device package of claim 11, wherein the epoxy resin composition further comprises an inorganic filler, and the inorganic filler comprises $TiO_2$-impregnated $SiO_2$.

* * * * *